(12) United States Patent
Pigoso Destro et al.

(10) Patent No.: US 11,990,763 B2
(45) Date of Patent: May 21, 2024

(54) RESONANCE GENERATOR SYSTEM AND METHOD FOR CAPTURING OSCILLATORY SIGNALS

(71) Applicant: Ibbx Inovacao em Sistemas de Software e Hardware Ltda, Capivari (BR)

(72) Inventors: Luis Fernando Pigoso Destro, Mombuca (BR); William Norberto Aloise, Sao Paulo (BR); Vanderlei Goncalves, Capivari (BR)

(73) Assignee: IBBX INOVAÇÃO EM SISTEMAS DE SOFTWARE E HARDWARE LTDA, Capivari (BR)

( * ) Notice: Subject to any disclaimer, the term of this patent is extended or adjusted under 35 U.S.C. 154(b) by 352 days.

(21) Appl. No.: 17/428,264

(22) PCT Filed: Feb. 18, 2020

(86) PCT No.: PCT/BR2020/050047
§ 371 (c)(1),
(2) Date: Aug. 3, 2021

(87) PCT Pub. No.: WO2020/168405
PCT Pub. Date: Aug. 27, 2020

(65) Prior Publication Data
US 2022/0123780 A1    Apr. 21, 2022

(30) Foreign Application Priority Data
Feb. 18, 2019    (BR) .................... BR102019003283-9

(51) Int. Cl.
*H02J 50/20* (2016.01)
*H02J 50/00* (2016.01)
(Continued)

(52) U.S. Cl.
CPC ............ *H02J 50/001* (2020.01); *H02J 50/20* (2016.02); *H03F 3/19* (2013.01); *H04B 1/44* (2013.01); *H03F 2200/451* (2013.01)

(58) Field of Classification Search
CPC .......... H02J 50/001; H02J 50/20; H04B 1/44; H03F 3/19; H03F 2200/451
See application file for complete search history.

(56) References Cited

U.S. PATENT DOCUMENTS 3,065,455 A * 11/1962 Roth .................. G08B 13/1618
                                                    367/95
3,257,608 A *  6/1966 Bell ...................... G01R 33/26
                                                    359/281
(Continued)

OTHER PUBLICATIONS

International Search Report dated Jun. 19, 2020 for International Application No. PCT/BR2020/050047.
(Continued)

*Primary Examiner* — Hai V Nguyen
(74) *Attorney, Agent, or Firm* — Lippes Mathias LLP

(57) ABSTRACT

The present invention refers to a resonance generator system (10) capable of being used in signal capturing systems. The resonance generator system (10) comprises a signal input, a signal output, an oscillation capture module (11), a signal amplifier module (12), a phase alignment module (13), an oscillation transmitter module (14), at least one receiving antenna (15) and a power source (16). The present invention also refers to a method for capturing oscillatory signals by way of a resonance generator system (10).

14 Claims, 4 Drawing Sheets

Figure 1:
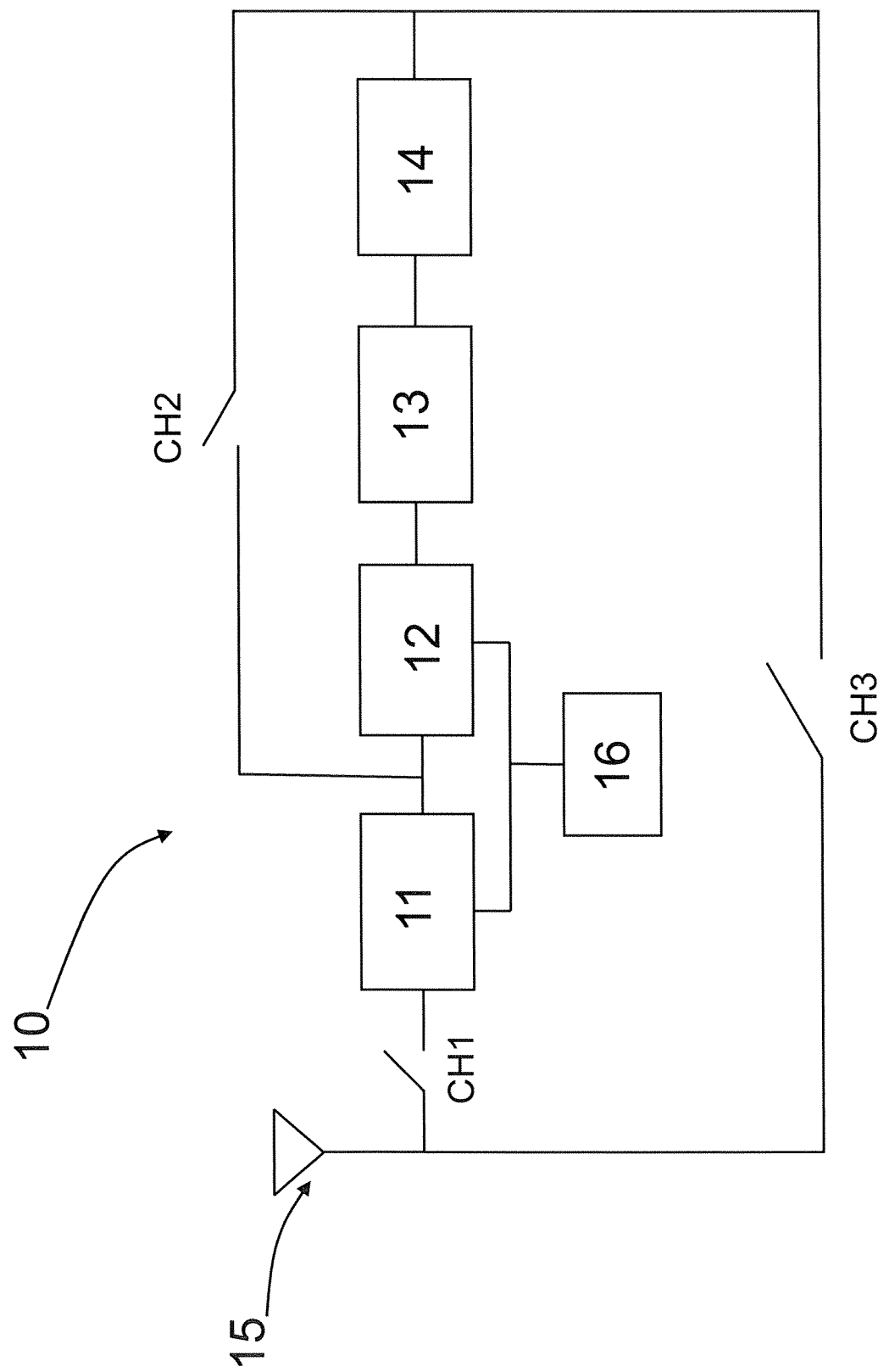

(51) Int. Cl.
      *H03F 3/19*      (2006.01)
      *H04B 1/44*      (2006.01)

(56)         References Cited

U.S. PATENT DOCUMENTS

| | | | | |
|---|---|---|---|---|
| 3,965,416 | A * | 6/1976 | Friedman | G01R 27/2664 |
| | | | | 73/304 C |
| 4,758,803 | A * | 7/1988 | Thomas, III | G01N 29/12 |
| | | | | 331/65 |
| 7,157,980 | B2 * | 1/2007 | Ogiso | H03K 3/0307 |
| | | | | 331/107 A |
| 7,633,311 | B2 * | 12/2009 | Pasqualini | H03K 19/018521 |
| | | | | 326/82 |
| 9,389,079 | B2 * | 7/2016 | Lee | G01C 19/661 |
| 11,349,340 | B2 * | 5/2022 | Pigoso Destro | H02J 50/12 |
| 11,539,243 | B2 * | 12/2022 | Katajamaki | H02J 50/10 |
| 11,548,423 | B2 * | 1/2023 | Uenal | B06B 1/0261 |
| 11,584,243 | B2 * | 2/2023 | Nook | H02J 7/0047 |
| 11,594,902 | B2 * | 2/2023 | Johnston | H02J 7/0042 |
| 11,611,222 | B2 * | 3/2023 | Nook | H01H 19/025 |
| 11,670,970 | B2 * | 6/2023 | Leabman | H02J 50/23 |
| | | | | 307/104 |
| 11,710,321 | B2 * | 7/2023 | Bell | G06V 10/42 |
| | | | | 320/108 |
| 11,722,177 | B2 * | 8/2023 | Leabman | H02J 50/402 |
| | | | | 320/108 |
| 2007/0229281 | A1 * | 10/2007 | Shionoiri | H01Q 9/285 |
| | | | | 340/572.7 |
| 2010/0019778 | A1 * | 1/2010 | Park | H02J 50/001 |
| | | | | 324/652 |
| 2011/0175461 | A1 * | 7/2011 | Tinaphong | H02J 50/27 |
| | | | | 307/149 |
| 2012/0133448 | A1 * | 5/2012 | Gregg | G01Q 60/52 |
| | | | | 331/116 R |
| 2016/0069686 | A1 * | 3/2016 | Lee | G01C 19/5691 |
| | | | | 356/460 |
| 2021/0257854 | A1 * | 8/2021 | Pigoso Destro | H02J 50/20 |

OTHER PUBLICATIONS

Written Opinion of the International Searching Authority dated Jun. 19, 2020 for International Application No. PCT/BR2020/050047.
International Preliminary Report on Patentability completed May 14, 2021 for International Application No. PCT/BR2020/050047.

* cited by examiner

RESONANCE GENERATOR SYSTEM AND METHOD FOR CAPTURING OSCILLATORY SIGNALS

The present invention refers to a resonance generator system capable of being used in signal capturing systems.

DESCRIPTION OF THE STATE OF THE ART

The use of resonant circuits associated to antennae is already widely known in the state of the art.

Usually said resonant circuits are composed of inductors and capacitors, configured so as to tune into a specific frequency. Also known are such circuits as use variable value elements such as, for example, variable capacitors, used to tune into a "range" of frequencies, instead of a single frequency.

In any case, said circuits are, usually, used to feed back and capture information and data through the air. An example of this is the transmission and reception of AM and/or FM radio.

In this scenario, resonant circuits are configured to feed back/receive the signal with the best possible quality. For example, when a user tunes into a specific FM radio, the circuit responsible for capturing the signal is configured so as to provide the user the best possible transmission quality, such that the user can listen to the audio with the least possible quantity of noise.

In other words, the resonant circuits already known in the state of the art are developed and configured to focus on the quality of the signal fed back, in which various enhancement parameters are used such as, for example, a low signal-noise ratio, a high sampling rate of the signal, etc.

However, the state of the art has no system configured so as to obtain, at its output, a rectified signal with maximum possible power. In other words, the state of the art has no system that enables the conversion of oscillatory signals present in the environment, that is, electromagnetic signals that permeate the means of transmission (for example, the air), such that said system can convert the oscillatory signal into a high-power rectified signal.

The present invention solve said problem of the state of the art by way of a resonance generator system and a method for capturing oscillatory signals that enable the oscillatory signal captured, such as for example an electromagnetic wave transmitted in the air, to be converted into a rectified signal presenting high yield.

Further, the present invention does not refer to a system and method focused on obtaining a resulting signal with high quality, being focused solely on providing means for obtaining a rectified signal with high gain in power.

Objectives of the Invention

A first objective of the present invention lies in providing a resonance generator system.

A second objective of the present invention lies in providing an oscillation capture module together with at least one receiving antenna.

A third objective of the present invention lies in providing a signal amplifier module.

A fourth objective of the present invention lies in providing a phase alignment module.

A fifth objective of the present invention lies in providing an oscillation transmitter module.

BRIEF DESCRIPTION OF THE INVENTION

The objectives of the present invention are achieved by means of a resonance generator system, the system comprising a signal input, a signal output, an oscillation capture module, a signal amplifier module, a phase alignment module, an oscillation transmitter module, at least one receiving antenna, a power source and at least one switching element, the system being configured for capturing oscillatory signals in the signal input of the system by way of at least one receiving antenna and the oscillation capture module, the signal amplifier module comprising at least one from between an amplifier system and an inductive transformer system, said signal amplifier module being configured to amplify the signal captured by the oscillation capture module at least once, the phase alignment module comprising at least one arrangement of capacitive and/or inductive elements, said phase alignment module being configured to align the phases of the signal amplified by the signal amplifier module to the phase of the signal present in the signal output of the resonance generator system, the oscillation transmitter module comprising at least one arrangement of semiconductors, configured so as to operate as switches, and the power source being configured to power electrically the oscillation capture module and the signal amplifier module.

The objectives of the invention are further achieved by means of a method for capturing oscillatory signals by way of a resonance generator system, said resonance generator system comprising a signal input, a signal output, an oscillation capture module, a signal amplifier module, a phase alignment module, an oscillation transmitter module, at least one receiving antenna, a power source and at least one switching element, the method comprising the steps of (a) energizing the signal amplifier module and the phase alignment module, (b) capturing, in the signal input of the resonance generator system, at least one oscillatory signal by way of at least one receiving antenna and the oscillation capture module, (c) sending the at least one signal captured in step (b) to the signal amplifier module and amplifying it at least once, (d) sending the at least one signal amplified in step (c) to the phase alignment module and aligning the phase of the signal, (e) sending the at least one signal aligned in the phase in step (d) to the oscillation transmitter module and transmitting the signal in pulsed form to the signal output of the resonance generator system, and (f) feeding back the signal present in the signal output of the system to the oscillation amplifier module.

SUMMARIZED DESCRIPTION OF THE DRAWINGS

Figure 2:
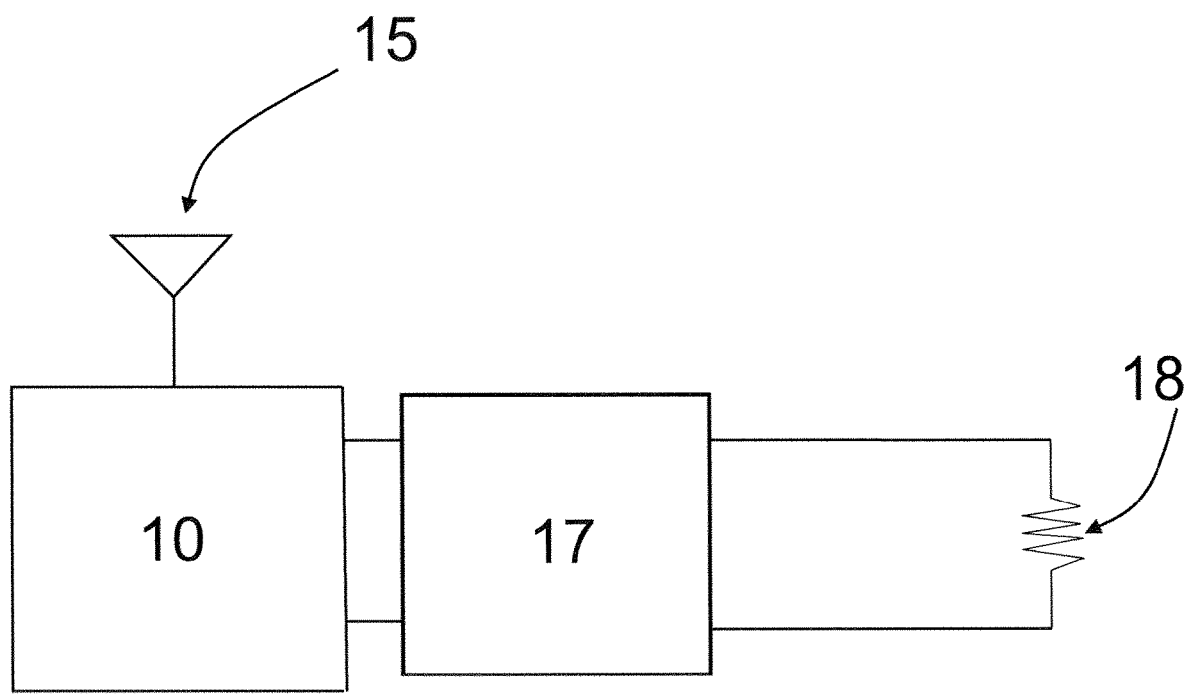

The present invention will now be described in further detail based on an example of execution represented in the drawings. The drawings show:

FIG. 1—illustrates an exemplary embodiment of the invention;

FIG. 2—illustrates an exemplary embodiment of the invention applied to a rectification and load storage system.

Figure 3:
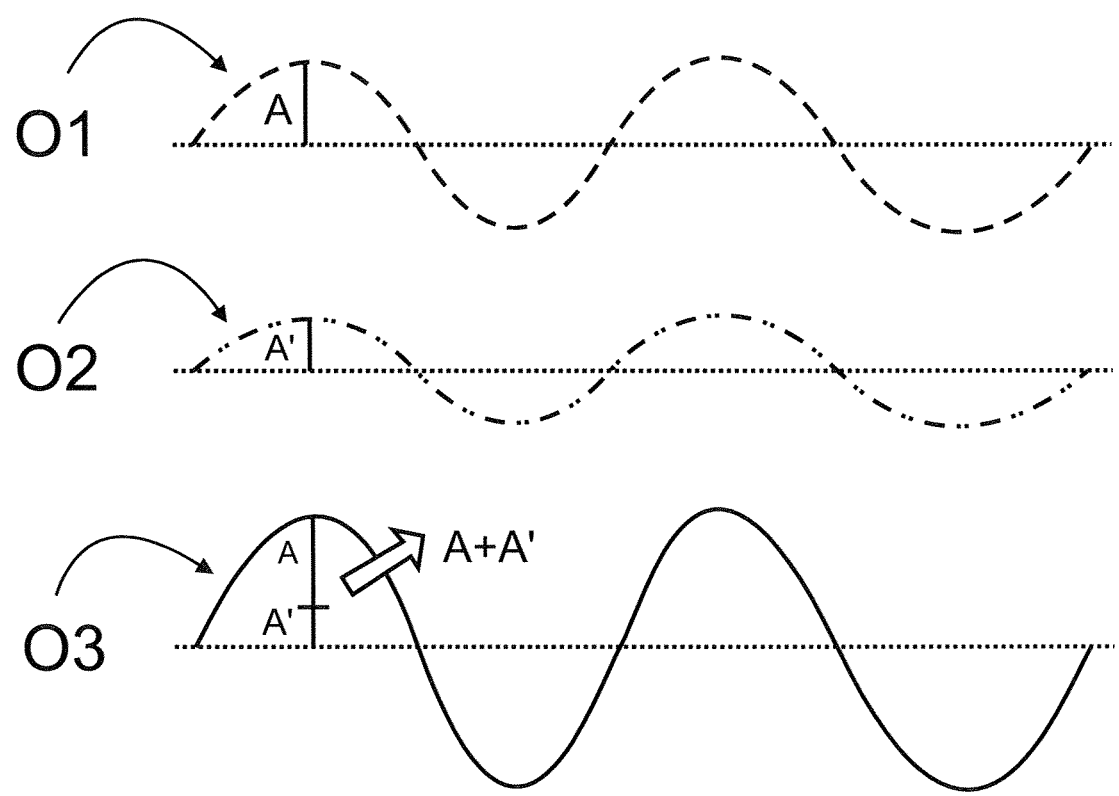

FIG. 3—illustrates an example of resonance between signals.

Figure 4:
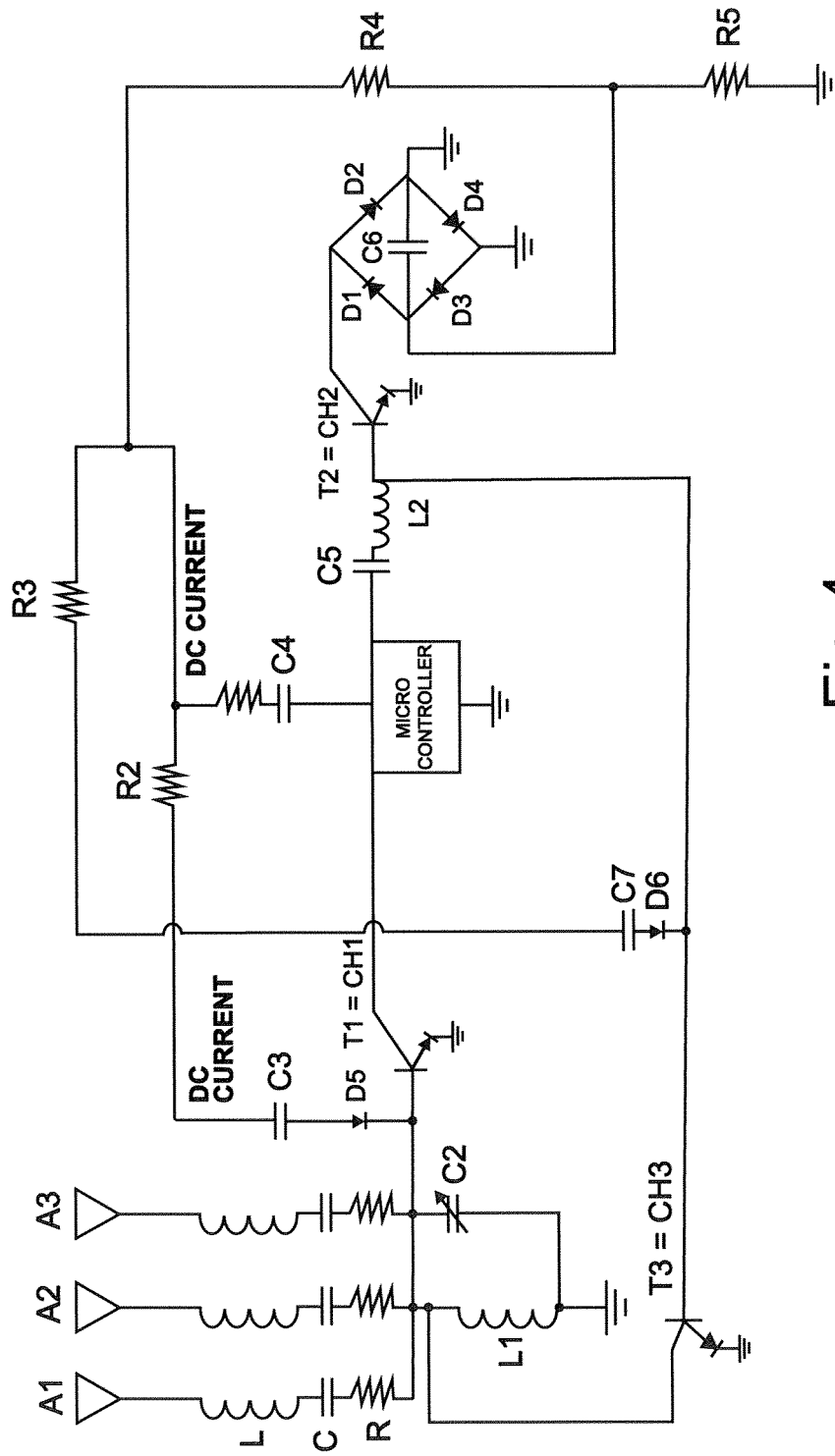

FIG. 4—illustrates a preferred embodiment of the invention.

DETAILED DESCRIPTION OF THE DRAWINGS

The present invention refers to a resonance generator system 10 capable of being used in signal capturing systems.

As can be noted in FIG. 1, in a preferred embodiment of the invention, the resonance generator system 10 comprises an oscillation capture module 11, a signal amplifier module 12, a phase alignment module 13, an oscillation transmitter module 14 and at least one receiving antenna 15. The resonance generator system 10 further comprises a signal input from a signal output.

Additionally, the resonance generator system 10 comprises at least one switching element CH1, CH2, CH3 and a power source 16. In a merely preferred embodiment, the power source 16 is electrically connected to the oscillation capture module 11 and to the signal amplifier module 12, providing energy thereto.

The at least one receiving antenna 15 is a magnetic antenna configured to enable the capture of oscillatory signals of various frequencies. The frequency of the signal which will be captured is directly linked to the sizes of the antenna and to its material, and to other electrical properties, according to the topology of the antenna chosen.

The at least one receiving antenna 15 may be arranged in various topologies. Preferably, the at least one receiving antenna 15 is a self-adjusting virtual flat antenna. Alternatively, the at least one receiving antenna 15 may be a helical or telescopic antenna, among others, and may or may not be a self-adjusting virtual antenna. Further, in a possible alternative embodiment, the at least one receiving antenna 15 may be a self-adjusting virtual antenna.

Further, the at least one receiving antenna 15 may be manufactured with various materials such as, for example, copper, tin, silver, iron oxide, among others. Merely preferably, the at least one receiving antenna 15 is made of copper.

Additionally, the at least one receiving antenna 15 may be made in many ways. Merely as an example, the at least one receiving antenna 15 may be printed on conventional boards of fiber glass (FR4) laminated in copper, as well as other dielectrics. The at least one receiving antenna 15 may also be made in a three-dimensional shape, without the use of dielectrics such as, for example, 3D antennae printed on 3D metal printers.

A self-adjusting virtual antenna comprises a physical portion of the antenna 15a, that is, an embodiment of the magnetic antenna as per the examples above and a load offsetting portion 15b, as described ahead.

As already known in the state of the art, the physical size of an antenna is given based on the wavelength or the frequency of the magnetic oscillation which is desirable to be captured.

In situations where the magnetic wavelength is large, that is, where the magnetic oscillation has a low frequency, to build an antenna with a size corresponding to said wave would be impracticable, since the antenna may be dozens of meters.

Therefore, to resolve said problem a load offsetting portion 15b is used as mentioned above, said portion 15b being responsible for "simulating" a physical size of an antenna in order to compensate the size of the real antenna.

In a possible embodiment, said load portion comprises an association of at least one inductive element and a capacitive element, which are associated to a control device 15c. Preferably, the capacitive element is a variable capacitor and the control device 15c is a microcontroller. The control device 15c is configured to alter the capacitance of the capacitive element by sending control signals.

However, said embodiment should not be considered as a limitation of the present invention, such that the capacitive element may be any element capable of having its capacitance modified based on a control signal such as, for example, a "varicap" diode.

Therefore, the control device 15c will analyze the frequency/period of the magnetic oscillation captured by the physical portion 15a of the receiving antenna 15 and will send a command signal to the capacitive element in order to alter its capacitance. Therefore, upon altering the capacitance of the capacitive element of the load offsetting portion 15b, the ratio of impedances and total reactances of the antenna will be altered, so as to enable the capture of the signal to be tuned into by the receiving antenna 15.

The resonance generator system 10 further comprises an oscillation capture module 11, which comprises at least a signal input, capable of receiving the signal captured by the at least one receiving antenna 15. Further, the oscillation capture module 11 is configured in such a way that it directly influences the working of the at least one receiving antenna 15.

Specifically, when the resonance generator system 10 is energized, the at least one receiving antenna 15 will intercept oscillatory signals of various frequencies. For the antenna to capture the signals in one or more desirable specific frequencies, the oscillation capture module 11 is used.

For the antennae to be tuned into specific frequencies, a tool widely used is tuning circuits, also called LC or RLC circuits, oscillatory circuits, etc.

Said resonant circuits comprise associations, in series and parallel, of capacitors, inductors and resistors. One of the simplest examples of a tuning circuit is the simples association in parallel with a capacitor with an inductor.

Resonant circuits have the so-called "resonance frequency". Said frequency is the natural frequency of this circuit in which both electric components have the same reactance. In other words, the resonant frequency is the frequency in which the circuit tends to oscillate exactly in the desired frequency.

The resonant frequency of a tuning circuit may be calculated by the expression below:

$$f_r = \frac{1}{2\pi\sqrt{LC}}$$

wherein L represents the inductance value of the inductor and C represents the capacitance value of the capacitor.

Therefore, if a tuning circuit is powered with signals of various frequencies, only the signal with the same frequency as the resonant frequency of the circuit will be captured. In other words, resonant circuits are configured to "select" a desired frequency, in order to enable only signals with this frequency to be processed.

In this sense, when there is the association of a tuning circuit with an antenna, which may or may not be a resonant antenna, it basically has the working as mentioned above. That is, the antenna will intercept signals of various frequencies, feed backing them to the resonance circuit. In turn, the resonance circuit will select (or tune into) only signals with the same frequency as its resonant frequency.

Therefore, and based on the information expounded above, the oscillation capture module 11 assumes the same function as a tuning circuit. That is, the oscillation capture module 11 is configured to enable the selection of a specific desired frequency, which will be tuned into and captured by the at least one receiving antenna 15.

Further, the oscillation capture module 11 is configured so as to enable the signal captured to be utilized to the maximum. In other words, the impedance of the oscillation capture module 11 is "matched" to the impedance of the desired signal. This enables the signal with the desired frequency to be captured with a minimum of losses/reflections possible, whereby increasing the yield of the resonance generator system 10.

In this sense, for the match between the impedance of the oscillatory signal captured and the impedance of the oscillation capture module 11 to occur, an impedance matching circuit is used. In one possible embodiment, the impedance matching circuit is composed of a module microcontroller, which is configured to analyze the impedance (resistance and reactances) of the oscillatory signal captured by the at least one receiving antenna 15 and a set of capacitance-varying diodes or a bank of switch capacitors and an inductor set.

When the oscillatory signal enter the microcontroller module, its impedance is analyzed and, for each impedance value, the microcontroller sends a signal to the capacitance-varying diodes so its capacitance is altered. Accordingly, the input impedance of the circuit is altered based on each signal received, guaranteeing the maximum transfer of power in the circuit.

Alternatively, it is emphasized that the components that make up the oscillation capture module 11 do not necessarily need to be fixed value components. In an exemplary, not limitative manner, the electric components that make up the oscillation capture module 11 may be components with adjustable values such as, for example, variable capacitors, potentiometers, varied capacitance diodes, variable inductors, etc.

Said components of variable values can be used, especially, when there is more than one frequency of the signals, which are desirable to capture. Additionally, the use of components with variable values enables greater design flexibility and adjustment of the system, enabling the signal, which is desirable to capture to be transferred with maximum efficiency to the other modules.

As mentioned previously, the resonance generator system 10 comprises at least one switching element CH1, CH2, CH3. Specifically, in a possible embodiment, which is illustrated by FIG. 1, the resonance generator system 10 comprises a first switching element CH1, which is disposed between the oscillation capture module 11 and the at least one receiving antenna 15. Said first switching element CH1 operates like a switch configured to alter between an "open" position and a "closed" position. Said switching is done at a preset frequency, defined by the user.

In one possible embodiment, the at least one switching element CH1, CH2 and CH3 are transistors. However, said embodiment should not be consideres as a limitation of the present invention, such that the at least one switching element CH1, CH2 and CH3 may be any elements that operate as switches such as, for example, electro-mechanical switches, diodes, etc.

Therefore, the first switching element CH1 will sometimes release, sometimes block the passage of the oscillatory signal captured by the at least one receiving antenna 15 to the oscillation capture module 11.

Additionally, and as mentioned previously, the resonance generator system 10 comprises a signal amplifier module 12, which is configured to amplify the signal tuned in/captured by the oscillation capture module 11.

In a preferred embodiment, the signal amplifier module 12 comprises an amplifier system and an inductive transformer system. Merely preferably, the amplifier system is a PNP and/or NPN junction amplifier system.

The PNP and/or NPN junction amplifier system may be, for example, a transistor, an operating amplifier, or any other known system of amplification of oscillatory signals. When in operation, the system receives the oscillatory signal at its input and amplifies it at its output, said operation being possible by the fact that the power source 16 is electrically connected to this system.

One fully valid embodiment of the inductive transformer system is that of a standard transformer, as is already known in the state of the art. Said system comprises a core and at least a winding, configured so as to enable the modification of voltage and current levels of the input signal, amplifying them at its output.

The provision of a signal amplifier module 12 enables the resonance between the oscillatory signals captured happens in a more accentuated manner, as described ahead. In this sense, said signal amplifier module 12 operates as a "catalyst" in the system, guaranteeing that the signal obtained at the output of the resonance generator system 10 has the maximum useful power utilized, in relation to the signal initially captured.

Therefore, in harmony with a description above, the signal amplifier module 12 amplifies the signal captured by the oscillation capture module 11 and amplifies it at least once, subsequently feed backing it to the phase alignment module 13. It has to be highlighted that the signal captured may be amplified once more by the signal amplifier module 12, such that the amount of times that the signal will be amplified is given based on various factors such as, for example, preset values of the energy of the signals that is desirable to the captured, design parameters of the system, between other. Therefore, the above description should not be construed as a limitation of the present invention, such that the signal may be amplified as many times as necessary.

As mentioned above, the signal amplified by the signal amplifier module 12 is fed back to the phase alignment module 13. Said phase alignment module 13 is configured to align the phase of the signals that are fed back by this module.

As detailed ahead, the resonance generator system 10 further comprises a second switching element CH2, which is disposed between the signal amplifier module 12 and the signal output of the system. In other words, there is a feedback of the output signal of the system to the input of the signal amplifier module 12, with the second switching element CH2 between them. Said second switching element CH2 operates like a switch configured to alter between an "open" position and a "closed" position. Said switching is done with a preset frequency, defined by the user.

Therefore, the signal present at the output of the resonance generator system 10 will be added to other oscillatory signals that continue to be captured by the at least one receiving antenna 15 and by the oscillation capture module 11, said added signals then being amplified again by the signal amplifier module and fed back to the phase alignment module 13. Said sum of signals occurs in the electrical conductor that connects the signal amplifier module 12 to the output of the resonance generator system 10.

Further, the sum of signals mentioned above is also called resonance between signals or overlapping of signals. FIG. 3 illustrates an example of resonance between signals. As can be seen from said figure, wave O3 is the wave resulting from the sum between wave O1 and wave O2. The amplitude of the resulting wave O3 is the sum of the amplitudes of waves O1 and O2. It is important to note that for the phenomenon of resonance or overlapping of signals to occur, the frequencies and the phases of the added signals must be equal.

To carry out the alignment of the phases of the signals that enter the phase alignment module 13, at least an arrangement of capacitive and/or inductive elements is used.

A concept known in the state of the art refers to the fact that the capacitive loads advance the current of a signal in relation to its voltage and inductive loads delay the current of a signal in relation to its voltage.

In this sense, the at least an arrangement of capacitive and/or inductive elements of the phase alignment module 13 is configured to align the current/voltage phases of the signals that are fed back by way of said phase alignment module 13.

As previously stated, the alignment of the current/voltage phase of the signals results in the constructive interference thereof. In other words, once the phases of the signals are aligned, the positive and negative semi-cycles of each signal captured and amplified are added up, resulting in an increased power gain at the output of the phase alignment module 13 and, consequently, in the resonance generator system 10.

In a preferred embodiment, and as stated above, the phase alignment module 13 comprises at least an arrangement of capacitive and/or inductive elements. However, said embodiment should not be construed as a limitation of the present invention, such that the phase alignment module 13 may be formed by any components capable of advancing and/or delaying the current/voltage phases of the signals.

Merely as an example, the phase alignment module 13 may be any active power factor correction (PFC) circuit.

Lastly, the resonance generator system 10 also comprises an oscillation transmitter module 14, configured to generate a resonance between two oscillation systems originally the same in frequency and amplitude, but at this moment with just the same frequencies but different amplitudes.

Accordingly, said oscillation transmitter module 14 comprises at least one arrangement of semiconductors, configured so as to operate the "ON/OFF" switches, feed backing the signal, with the phase previously aligned by the phase alignment module 13, in pulsed/oscillated form to the output of the system. Merely preferably, the at least one arrangement of semiconductors are PNP and/or NPN semiconductors such as, for example, transistors operating as "ON/OFF" switches.

Additionally, the resonance generator system 10 may further comprise a third switching element CH3, disposed between the at least one receiving antenna 15 and the output of the resonance generator system 10. Said third switching element CH3 operates like a switch configured to alter between an "open" position and a "closed" position. Said switching is done with a preset frequency, defined by the user.

Said third switching element CH3 is configured especially to prevent energy from returning to the input of the system. In one possible embodiment, the third switching element CH3 is a diode.

Therefore, the integration of the at least one receiving antenna 15 with an oscillation capture module 11, a signal amplifier module 12, a phase alignment module 13 and an oscillation transmitter module 14, said integration configuring the resonance generator system 10 of the present invention, enables the oscillatory signals of various desirable frequencies to be captured, so as to obtain maximum energy yield at the output of the system. In other words, the present invention provides a system configured to capture and convert oscillatory signals from various frequencies such as, for example, electromagnetic radiations, and convert them into electric switching alternating) signals at its output, said conversion being carried out so as to make full use of the signal captured, whereby obtaining an optimal operating yield.

The resonance generator system 10 now proposed may be used jointly with other systems already known in the state of the art.

Merely as an example, and as illustrated in FIG. 2, the resonance generator system 10 is associated to a rectifier element 17 and to a load element 18. Merely as an example, the rectifier element 17 may be any signal rectifier device already known in the state of the art that converts an alternating signal into a continuous signal.

Further, the load element 18 may be, for example, any power-storing element. Alternatively, the load element 18 may be any load capable of using the rectified signal, captured by the resonance generator system 10 now proposed.

Additionally, the present invention refers to a method for capturing oscillatory signals by way of a resonance generator system 10, said resonance generator system 10 comprising a signal input, a signal output, an oscillation capture module 11, a signal amplifier module 12, a phase alignment module 13, an oscillation transmitter module 14, at least one receiving antenna 15, a power source 16 and at least one switching element CH1, CH2, CH3, the method comprising the steps of (a) energizing the signal amplifier module 12 and the phase alignment module 13, (b) capturing, in the signal input of the resonance generator system 10, at least one oscillatory signal by way of the at least one receiving antenna 15 and the oscillation capture module 11, (c) sending the at least one signal captured in step (b) to the signal amplifier module 12 and amplifying it at least once, (d) sending the at least one signal amplified in step (c) to the phase alignment module 13 and aligning the phase of the signal, (e) sending the at least one signal phase-aligned in step (d) for the oscillation transmitter module 14 and transmitting the signal in pulsed form to the signal output of the resonance generator system 10, and (f) feeding back the signal present in the signal output of the system 10 for the oscillation amplifier module 12.

Lastly, and in harmony with the information now presented, a description follows of a preferred embodiment of the invention, which is illustrated in FIG. 4.

Using the elements presented in FIG. 4 as reference, it is noted that the oscillation capture block 11 and the receiving antenna 15 are embodied by way of at least one physical antenna A1, A2, A3, at least an inductor L, a capacitor C and a resistor R associated to each one of the at least one antenna A1, A2, A3 and an inductor L1 associated in parallel to a variable capacitor C2.

In contrast, the signal amplifier module 12 is embodied by means of a power source $DC_{CURRENT}$, associated to a capacitor C3, to a diode D5 and to a transistor T1. It is noted that the transistor T1 also corresponds to the first switching element CH1.

The phase alignment module 13 is embodied by means of a power source $DC_{CURRENT}$ associated to a capacitor C4, and to a microcontroller associated to a capacitor C5 and to an inductor L2.

Lastly, the oscillation transmitter module 14 is embodied by means of a transistor T3. It is noted that said transistor T3 also corresponds to the third switching element CH3.

Further, the circuit illustrated in FIG. 4 also discloses a transistor T2 associated to a rectifying bridge, composed of the diodes D2, D3 and D4 and by the capacitor C6. Additionally, the resistor R5 represented in the figure illustrates a load of the system to be powered. It is noted that the transistor T2 corresponds to the second switching element CH2.

Other components of the circuit are present in order to enable its correct working in accordance with the teachings of the present invention.

Having described an example of a preferred embodiment, it should be understood that the scope of the present invention covers other possible variations, being limited solely by the content of the accompanying claims, potential equivalents being included therein.

The invention claimed is:

1. A resonance generator system (10), the system comprising a signal input, a signal output, an oscillation capture module (11), a signal amplifier module (12), a phase alignment module (13), an oscillation transmitter module (14), at least one receiving antenna (15), a power source (16), at least one switching element (CH1, CH2, CH3) and a load element (18),
   the system being configured for capturing oscillatory signals in the signal input of the system by way of the at least one receiving antenna (15) and the oscillation capture module (11),
   the signal amplifier module (12) comprising at least one amplifier system or at least one inductive transformer system, said signal amplifier module (12) being configured to amplify the signal captured by the oscillation capture module (11) at least once,
   the phase alignment module (13) comprising at least one arrangement of capacitive and/or inductive elements, said phase alignment module (13) being configured to align the phases of the signal amplified by the signal amplifier module (12) to the phase of a signal present in the signal output of the resonance generator system (10),
   the oscillation transmitter module (14) comprising at least one arrangement of semiconductors, configured so as to operate as switches and configured to feed back the signal, with the phase previously aligned by the phase alignment module (13), in pulsed/oscillated form to the output of the resonance generator system (10), and
   the power source (16) being configured to electrically power the oscillation capture module (11) and the signal amplifier module (12),
   the load element (18) being electrically connected to the signal output of the resonance generator system (10) and being supplied by the signal present in the signal output of the resonance generator system (10),
   an output signal of the phase alignment module (13) being fed back to the oscillation capture module (11) by means of the at least one switching element (CH1, CH2, CH3) so as to generate a resonance between the phase-aligned signal and the at least one oscillatory signal captured by the oscillation capture module (11).

2. The system according to claim 1, wherein the oscillation capture module (11) is electrically associated to the signal amplifier module (12), which in turn is electrically associated to the phase alignment module (13), the phase alignment module (13) being electrically associated to the oscillation transmitter module (14), and the at least one receiving antenna (15) is electrically associated to the signal amplifier module (12).

3. The system according to claim 1, wherein the at least one switching element (CH1, CH2, CH3) is a first switching element (CH1), a second switching element (CH2) and a third switching element (CH3).

4. The system according to claim 3, wherein the first switching element (CH1) is disposed between the at least one receiving antenna (15) and the oscillation capture module (11).

5. The system according to claim 3, wherein the second switching element (CH2) is disposed between the signal output of the system (10) and the signal amplifier module (12).

6. The system according to claim 3, wherein the third switching element (CH3) is disposed between a signal output of the system (10) and the at least one receiving antenna (15).

7. The system according to claim 1, wherein the power source (16) is electrically associated to the oscillation capture module (11) and to the signal amplifier module (12).

8. The system according to claim 1, wherein the amplifier system present in the signal amplifier module (12) is a NPN/PNP junction semiconductor amplifier system.

9. The system according to claim 1, wherein the phase alignment module (13) is a power factor correction circuit.

10. The system according to claim 1, wherein the at least one arrangement of semiconductors comprised in the oscillation transmitter module (14) is an arrangement of NPN/PNP junction semiconductors.

11. A method for capturing oscillatory signals by way of a resonance generator system (10), said resonance generator system (10) comprising a signal input, a signal output, an oscillation capture module (11), a signal amplifier module (12), a phase alignment module (13), an oscillation transmitter module (14), at least one receiving antenna (15), a power source (16), at least one switching element (CH1, CH2, CH3) and a load element (18),
   the method comprising the steps of:
   (a) energizing the signal amplifier module (12) and the phase alignment module (13),
   (b) capturing, in the signal input of the resonance generator system (10), at least one oscillatory signal by way of the at least one receiving antenna (15) and the oscillation capture module (11),
   (c) sending the at least one signal captured in step (b) to the signal amplifier module (12) and amplifying it at least once,
   (d) sending the at least one signal amplified in step (c) to the phase alignment module (13) and aligning the phase of the signal,
   (e) sending the phase-aligned signal in step (d) to the oscillation transmitter module (14) and transmitting the signal in pulsed form to the signal output of the resonance generator system (10),
   (f) feeding back the phase-aligned signal in step (d) to the oscillation capture module (11) so as to generate a resonance between the phase-aligned signal and the at least one oscillatory signal captured in step (b)
   (g) supply a load element (18) with the signal present in the signal output of the system (10), and
   (h) feeding back the signal present in the signal output of the system (10) to the oscillation amplifier module (12).

12. The method according to claim 11, wherein step (a) is carried out by the power source (16).

13. The method according to claim 11, wherein a first switching element (CH1), disposed between the at least one receiving antenna (15) and the oscillation capture module (11), is configured to enable or disable the capture of step (b).

14. The method according to claim 11, wherein the feeding back of step (h) occurs by means of a second switching element (CH2).

* * * * *